(12) United States Patent
Boja et al.

(10) Patent No.: US 9,659,815 B2
(45) Date of Patent: May 23, 2017

(54) SYSTEM, METHOD, AND COMPUTER PROGRAM PRODUCT FOR A CAVITY PACKAGE-ON-PACKAGE STRUCTURE

(71) Applicant: NVIDIA Corporation, Santa Clara, CA (US)

(72) Inventors: Ronilo V. Boja, Gilroy, CA (US); Teckgyu Kang, Saratoga, CA (US); Abraham Fong Yee, Cupertino, CA (US)

(73) Assignee: NVIDIA Corporation, Santa Clara, CA (US)

( * ) Notice: Subject to any disclaimer, the term of this patent is extended or adjusted under 35 U.S.C. 154(b) by 122 days.

(21) Appl. No.: 14/162,696

(22) Filed: Jan. 23, 2014

(65) Prior Publication Data
US 2015/0206848 A1 Jul. 23, 2015

(51) Int. Cl.
*H01L 21/768* (2006.01)
*H01L 23/13* (2006.01)
(Continued)

(52) U.S. Cl.
CPC ...... *H01L 21/76877* (2013.01); *H01L 21/563* (2013.01); *H01L 23/13* (2013.01); *H01L 23/49811* (2013.01); *H01L 23/49827* (2013.01); *H01L 23/5384* (2013.01); *H01L 23/5385* (2013.01); *H01L 25/105* (2013.01); *H01L 25/50* (2013.01); *H01L 23/5389* (2013.01); *H01L 24/13* (2013.01); *H01L 24/16* (2013.01); *H01L 24/32* (2013.01); *H01L 24/73* (2013.01); *H01L 24/92* (2013.01); *H01L 2224/131* (2013.01); *H01L 2224/16225* (2013.01); *H01L 2224/16227* (2013.01); *H01L 2224/26175* (2013.01); *H01L 2224/32225* (2013.01); *H01L 2224/73204* (2013.01); *H01L 2224/92125* (2013.01); *H01L 2225/1023* (2013.01); *H01L 2225/1058* (2013.01); *H01L 2924/12041* (2013.01); *H01L 2924/12042* (2013.01);
(Continued)

(58) Field of Classification Search
CPC ........................................................ H01L 24/17
See application file for complete search history.

(56) References Cited

U.S. PATENT DOCUMENTS 6,031,284 A * 2/2000 Song ..................... H01L 23/13
257/686
8,030,746 B2 * 10/2011 Tan ................................ 257/686
(Continued)

FOREIGN PATENT DOCUMENTS

JP 2009182284 A * 8/2009

*Primary Examiner* — Lex Malsawma
(74) *Attorney, Agent, or Firm* — Zilka-Kotab, PC

(57) ABSTRACT

A system, method, and computer program product are provided for producing a cavity bottom package of a package-on-package structure. The method includes the steps of receiving a bottom package comprising a substrate material having a top layer including a first set of pads configured to be electrically coupled to a second set of pads of an integrated circuit die. A layer of non-conductive material is applied to the top layer of the bottom package and a cavity is formed in the layer of non-conductive material to expose the first set of pads, where the cavity is configured to contain the integrated circuit die oriented such that the second set of pads face the first set of pads.

20 Claims, 11 Drawing Sheets

(51) Int. Cl.
    *H01L 21/56*     (2006.01)
    *H01L 25/10*     (2006.01)
    *H01L 25/00*     (2006.01)
    *H01L 23/498*     (2006.01)
    *H01L 23/538*     (2006.01)
    *H01L 23/00*     (2006.01)

(52) U.S. Cl.
    CPC ............... *H01L 2924/15153* (2013.01); *H01L 2924/15311* (2013.01); *H01L 2924/15331* (2013.01); *H01L 2924/3511* (2013.01)

(56) References Cited

U.S. PATENT DOCUMENTS

| | | | | |
|---|---|---|---|---|
| 8,159,828 B2* | 4/2012 | Sun | ........................ | H01L 25/16 361/702 |
| 8,704,365 B2* | 4/2014 | Park et al. | ................... | 257/724 |
| 2006/0240338 A1* | 10/2006 | Satoh | ................. | H01L 21/76838 430/5 |
| 2007/0069371 A1* | 3/2007 | Iksan | ................... | H01L 23/3128 257/706 |
| 2007/0096292 A1* | 5/2007 | Machida | ........................ | 257/700 |
| 2008/0265395 A1* | 10/2008 | Hasegawa et al. | ............ | 257/690 |
| 2008/0296056 A1* | 12/2008 | Kinoshita | ................ | H01L 23/13 174/261 |
| 2009/0243065 A1* | 10/2009 | Sugino et al. | ................. | 257/686 |
| 2009/0243072 A1* | 10/2009 | Ha et al. | ........................ | 257/686 |
| 2010/0019368 A1* | 1/2010 | Shin | ........................ | H01L 23/24 257/686 |
| 2010/0044853 A1* | 2/2010 | Dekker et al. | ................. | 257/692 |
| 2011/0024899 A1* | 2/2011 | Masumoto et al. | ........... | 257/737 |
| 2013/0020120 A1* | 1/2013 | Ishihara | ................ | H05K 1/183 174/262 |
| 2015/0014031 A1* | 1/2015 | Lin et al. | ....................... | 174/258 |
| 2015/0061142 A1* | 3/2015 | Hsu et al. | ..................... | 257/773 |

* cited by examiner

US 9,659,815 B2

SYSTEM, METHOD, AND COMPUTER PROGRAM PRODUCT FOR A CAVITY PACKAGE-ON-PACKAGE STRUCTURE

FIELD OF THE INVENTION

The present invention relates to an integrated circuit package, and more particularly to a bottom package of a package-on-package (PoP) structure.

BACKGROUND

A conventional package-on-package (PoP) structure provides an integrated circuit die coupled to a memory device using a bottom package that contains the integrated circuit die and a top package that contains one or more memory die. FIG. 1A illustrates a prior art PoP structure 100. An integrated circuit die 110 may be mounted on top of a bottom package 125 using a flip-chip configuration so that solder balls provide a die to bottom package coupling 115. The bottom package 125 includes a bottom package coupling 112 (e.g., solder balls, bumps, dots, etc.) to couple the bottom package 125 portion of the PoP structure to a printed circuit board or other system substrate.

The bottom package 125 includes pads 122 on the top of the bottom package 125 that are coupled to a top package 105 by a top package to bottom package coupling 120 (e.g., solder balls). The solder balls that provide the top package to bottom package coupling 120 need to be sized to meet a clearance requirement between the bottom package 125 and the top package 105. Specifically, the top package 105 should not contact the die 110. The solder balls should also be positioned far enough apart from each other so that electrical shorts do not occur between adjacent solder balls. Therefore, as the clearance requirement increases, the pitch between the top package to bottom package coupling 120 also increases. As the pitch increases, the number of separate electrical connections provided by the top package to bottom package coupling 120 for a PoP structure decreases.

FIG. 1B illustrates a prior art overmolded bottom package 135 that uses Thru Mold Via Technology (TMV®) PoP package. Compared with the bottom package 125 of the PoP structure 100, the overmolded bottom package 135 is more expensive to construct. An integrated circuit die 160 may be mounted on top of the overmolded bottom package 135 using a flip-chip configuration so that solder balls provide a die to bottom package coupling 155. The overmolded bottom package 140 includes a bottom package coupling 140 (e.g., solder balls) to couple the overmolded bottom package 140 to a printed circuit board or other system substrate. The overmolded bottom package 135 also includes pads 132 that may be coupled to a top package (not shown) by solder balls 152.

The pads 132 and solder balls 152 are formed on the top surface of the overmolded bottom package 135 before molding compound 140 is deposited to cover the entire top surface of the overmolded bottom package 135. A typical size for one of the solder balls 152 is 200 microns in diameter. The molding compound 140 is deposited to cover the entire top surface of the overmolded bottom package 135 and then, laser-cut vias 142 are formed to expose the solder balls 152. As shown in FIG. 1B, the molding compound 140 covers the integrated circuit die 160.

FIG. 1C illustrates the prior art overmolded bottom package 135 of FIG. 1B within a prior art MTV PoP structure 165. The molding compound 140 is used to meet a clearance requirement between the overmolded bottom package 135 and a top package 175 within the TMV PoP Structure 165. The vias 142 that are formed in the molding compound 140 prevent the solder balls 152 from collapsing after the top package 175 is coupled to the overmolded bottom package 135 and causing electrical shorts between the solder balls 152. The top package 175 is electrically coupled to the overmolded bottom package 135 by top package to bottom package coupling 162 (e.g., solder balls). The top package 175 is surface mounted to the exposed solder balls 152 on the overmolded bottom package 135 to form the TMV PoP structure 165. After a hot air reflow process (e.g., a reflow process utilizing a reflow oven, an infrared heater, etc.) is applied to the TMV PoP structure 165, the solder balls comprising the top package to bottom package coupling 162 and the solder balls 152 combine to form pillars of conductive material coupled to each of the pads 132.

In contrast with the top package to bottom package coupling 120 of the PoP structure 100, the solder balls comprising the top package to bottom package coupling 162 may be smaller in size because the top package to bottom package coupling 162 need not be sized to meet the clearance requirement between the overmolded bottom package 135 and the top package 175 within the TMV PoP Structure 165. Therefore, the solder balls 152 may be smaller, allowing for a smaller pitch for a top package to bottom package coupling 162 and more separate electrical connections between the top package 175 and the overmolded bottom package 135. A typical size for one of the solder balls in the top package to bottom package coupling 162 is 200 microns in diameter. However, the number of processing steps is increased to produce the overmolded bottom package 135 compared with the bottom package 125. Specifically, additional processing steps are needed to provide the solder balls 152, the molding compound 140, and the laser-cut vias 142. Thus, there is a need for addressing these issues and/or other issues associated with the prior art.

SUMMARY

A system, method, and computer program product are provided for producing a cavity bottom package of a package-on-package structure. The method includes the steps of receiving a bottom package comprising a substrate material having a top layer including a first set of pads configured to be electrically coupled to a second set of pads of an integrated circuit die. A layer of non-conductive material is applied to the top layer of the bottom package and a cavity is formed in the layer of non-conductive material to expose the first set of pads, where the cavity is configured to contain the integrated circuit die oriented such that the second set of pads face the first set of pads.

DETAILED DESCRIPTION

A technique for preparing a cavity bottom package for use within a PoP structure has different processing steps compared with producing the bottom overmolded package 135. The cavity bottom package enables a smaller solder ball pitch compared with the bottom package 125 and the bottom overmold package 135, thereby enabling a greater number of separate electrical connections between the cavity bottom package and a top package. A non-conductive material is laminated to a top layer of a substrate material and a cavity is provided by removing a portion of the non-conductive material to prepare the cavity bottom package. The height of the non-conductive material provides clearance between the top layer of a substrate material and a top package. The non-conductive material may have characteristics that reduce PoP structure failures due to warpage.

Figure 2:
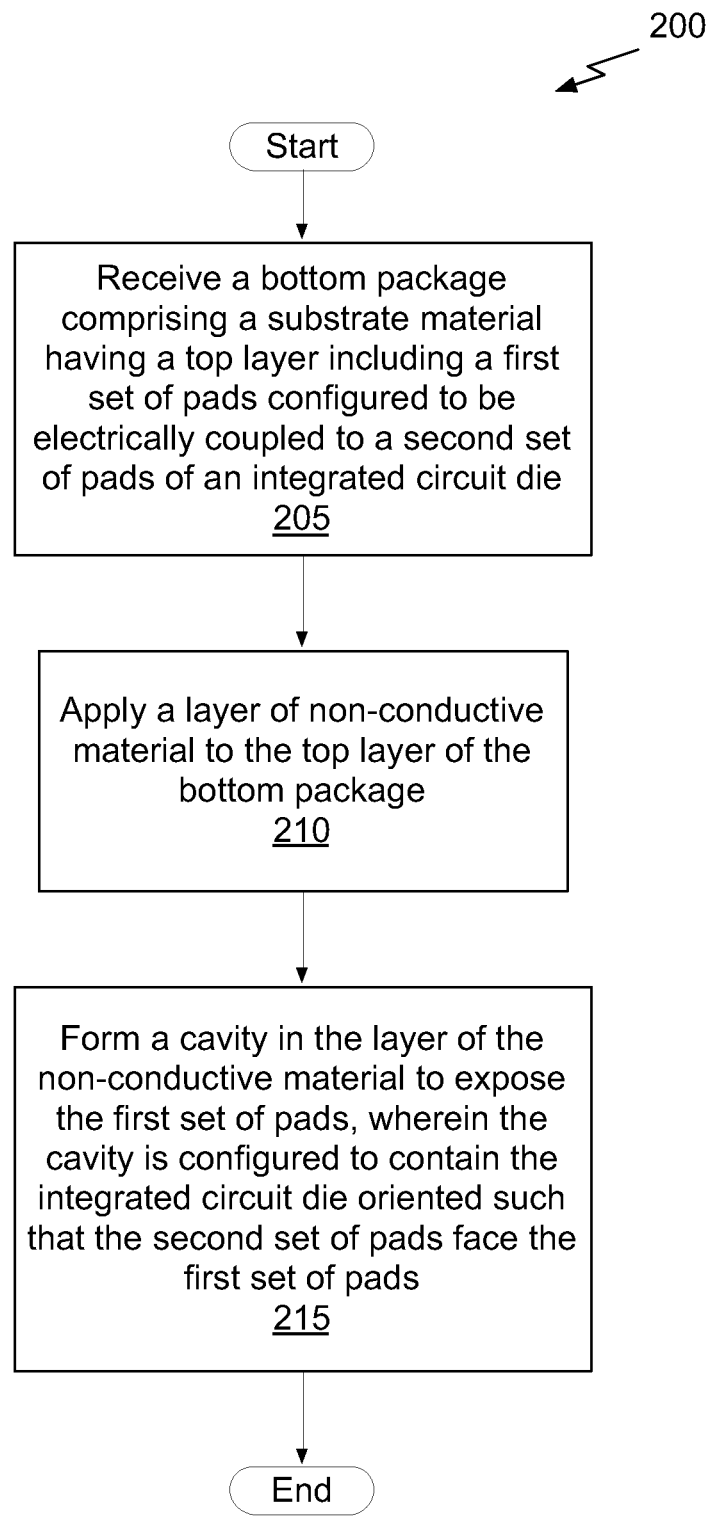
FIG. 2 illustrates a flowchart of a method for preparing a cavity bottom package for use within a PoP structure, in accordance with one embodiment.

FIG. 2 illustrates a flowchart of a method 200 for preparing the cavity bottom package for use within a PoP structure, in accordance with one embodiment. Although method 200 is described in the context of certain circuit and system implementations described in FIGS. 3A, 3B, 3C, 3D, 4, and 6, the method 200 may also be performed by a software program, other custom circuitry, or by a combination of custom circuitry and a software program. Furthermore, persons of ordinary skill in the art will understand that any system that performs method 200 is within the scope and spirit of embodiments of the present invention.

At step 205, a bottom package comprising a substrate material is received. The substrate material comprises a top layer including a first set of pads that are configured to be electrically coupled to a second set of pads of an integrated circuit die. In the context of the present description, the substrate material is a non-conductive material. Examples of substrate materials include, GHPL-830NSFLC for the build-up layers and HL832NST type LCA for the core layer. The integrated circuit die may comprise one or more silicon based integrated circuits (e.g., a central processing unit (CPU), a graphics processing unit (GPU), a memory unit, etc.). In one embodiment, the integrated circuit die is implemented so that the second set of pads are electrically coupled to the first set of pads using a flip-chip process.

In the context of the present description, the first set of pads may each include an area on the top layer of the substrate material to be electrically connected with a corresponding area of a pad in the second set of pads during an assembly process. In the context of the present description, the pads may be made of a conductive material, such as metal (e.g., copper). In one embodiment, the pads in the first set of pads may be affixed to the top layer of the substrate material by printing the pads, silk-screening the pads, laminating the pads, etc.

At step 210, a layer of non-conductive material is applied to the top layer of the bottom package. In one embodiment, the non-conductive material is a prepreg material (i.e., fiberglass material impregnated with resin). In one embodiment, the non-conductive material is the same as the substrate material or is otherwise compatible with the substrate material. In one embodiment, a coefficient of thermal expansion of the non-conductive material substantially matches (i.e., is within 5% compared with) a coefficient of thermal expansion of the substrate material. In one embodiment, the non-conductive material is a high modular material that is substantially rigid.

At step 215, a cavity is formed in the layer of the non-conductive material, where the cavity is configured to contain the integrated circuit die oriented such that the second set of pads face the first set of pads. The cavity may be formed by removing a portion of the non-conductive material to expose the first set of pads. In one embodiment, a depth of the cavity is greater than a height of the integrated circuit die so that when the bottom package is coupled to a top package to form a PoP structure, the top package does not contact the integrated circuit die. In another embodiment, a depth of the cavity combined with a height of a coupling between the bottom package and the top package is greater than a combined height of the integrated circuit die and a coupling between the integrated circuit die and the bottom package when the integrated circuit is mounted within the cavity so that the top package does not contact the integrated circuit die. In one embodiment, non-conductive material may be removed by laser cutting, laser drilling, or mechanical drilling.

In one embodiment, the bottom package is coupled to a top package to form a PoP structure, and the top package may include one or more integrated circuit die combined vertically (e.g., stacked, etc.), where one die is stacked on top of another die. In one embodiment, the bottom package may include a ball grid array on a surface of the bottom package opposing the top layer of the substrate. For example, a plurality of solder balls may be coupled to a bottom surface of the bottom package (e.g., utilizing flux, etc.).

In one embodiment, the top layer of the substrate material includes a third set of pads that are configured to be electrically coupled to a fourth set of pads on a top surface of the layer of the non-conductive material through vias that are configured to provide conductive paths through the layer of the non-conductive material. In one embodiment, the vias are produced by mechanical drilling. In one embodiment, each via of the vias is less than or equal to 100 microns in diameter.

In the context of the present description, the third set of pads may each include an area on the top layer of the substrate to be electrically connected with a corresponding area of a pad in the fourth set of pads. In one embodiment, the pads in the third set of pads may be affixed to the top layer of the substrate material by printing the pads, silk-screening the pads, laminating the pads, etc. In one embodiment, the pads in the fourth set of pads may be affixed to the layer of the non-conductive material by printing the pads, silk-screening the pads, laminating the pads, etc. The fourth set of pads may be pads located at the top surface of the bottom package that are configured to be electrically coupled to a fifth set of pads of a top package during the assembly process to form a PoP structure. In one embodiment, a clearance provided by an electrical coupling (e.g., solder ball) between the fifth set of pads and the fourth set of pads is less than or equal to 100 microns.

More illustrative information will now be set forth regarding various optional architectures and features with which the foregoing framework may or may not be implemented, per the desires of the user. It should be strongly noted that the following information is set forth for illustrative purposes and should not be construed as limiting in any manner. Any of the following features may be optionally incorporated with or without the exclusion of other features described.

Figure 1A:
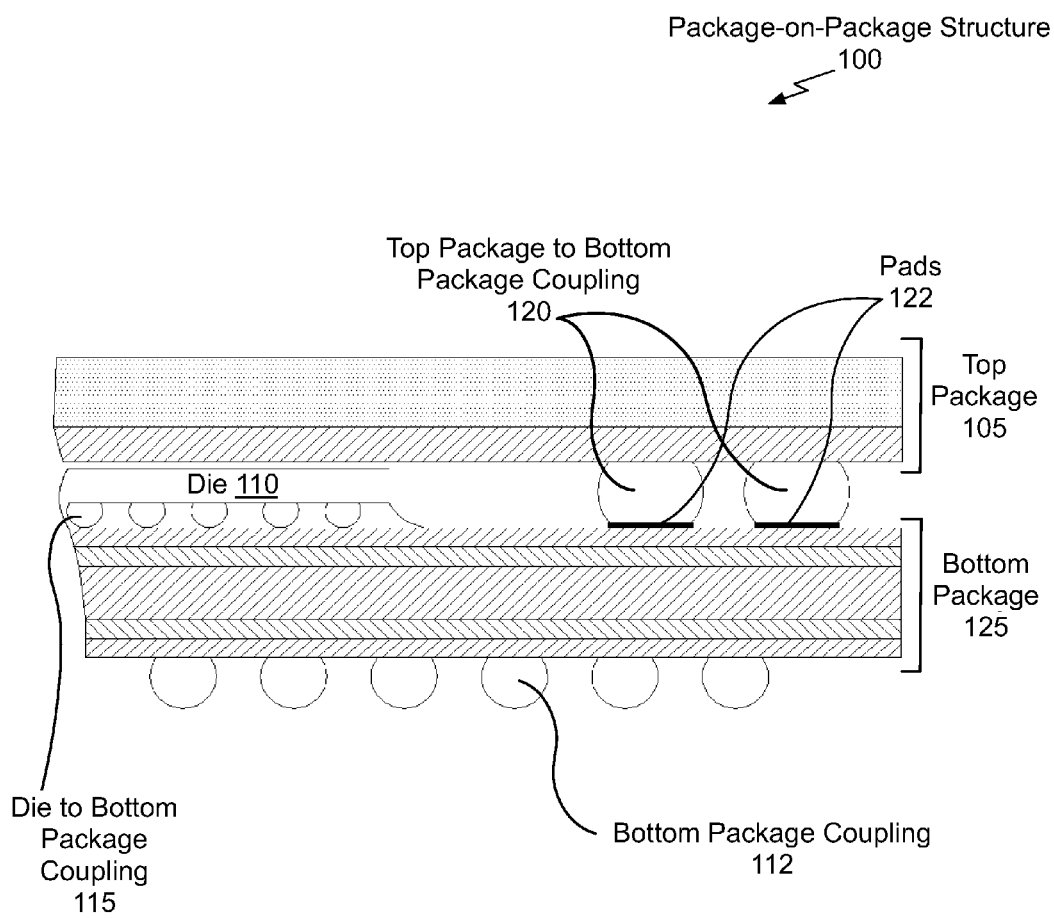
FIG. 1A illustrates a prior art PoP structure.
Figure 1B:
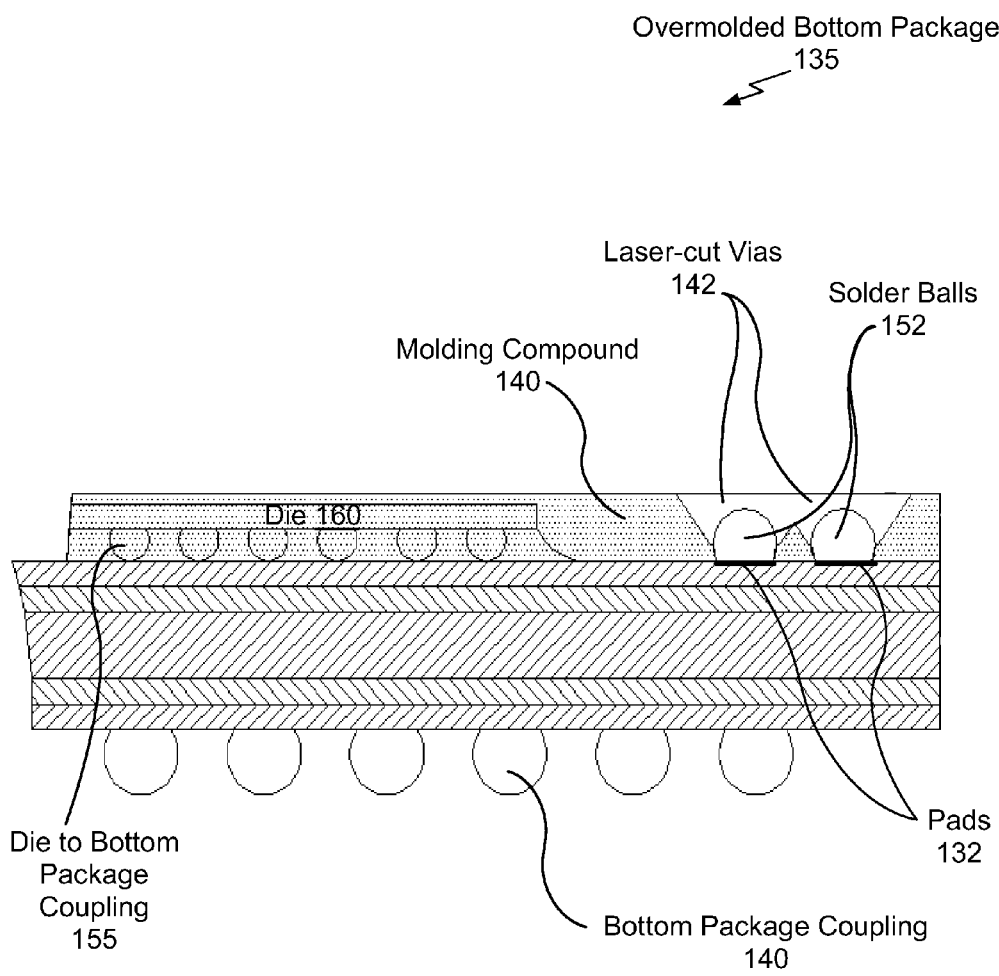
FIG. 1B illustrates a prior art overmolded bottom package that uses Thru Mold Via Technology (TMV®) PoP structure.
Figure 1C:
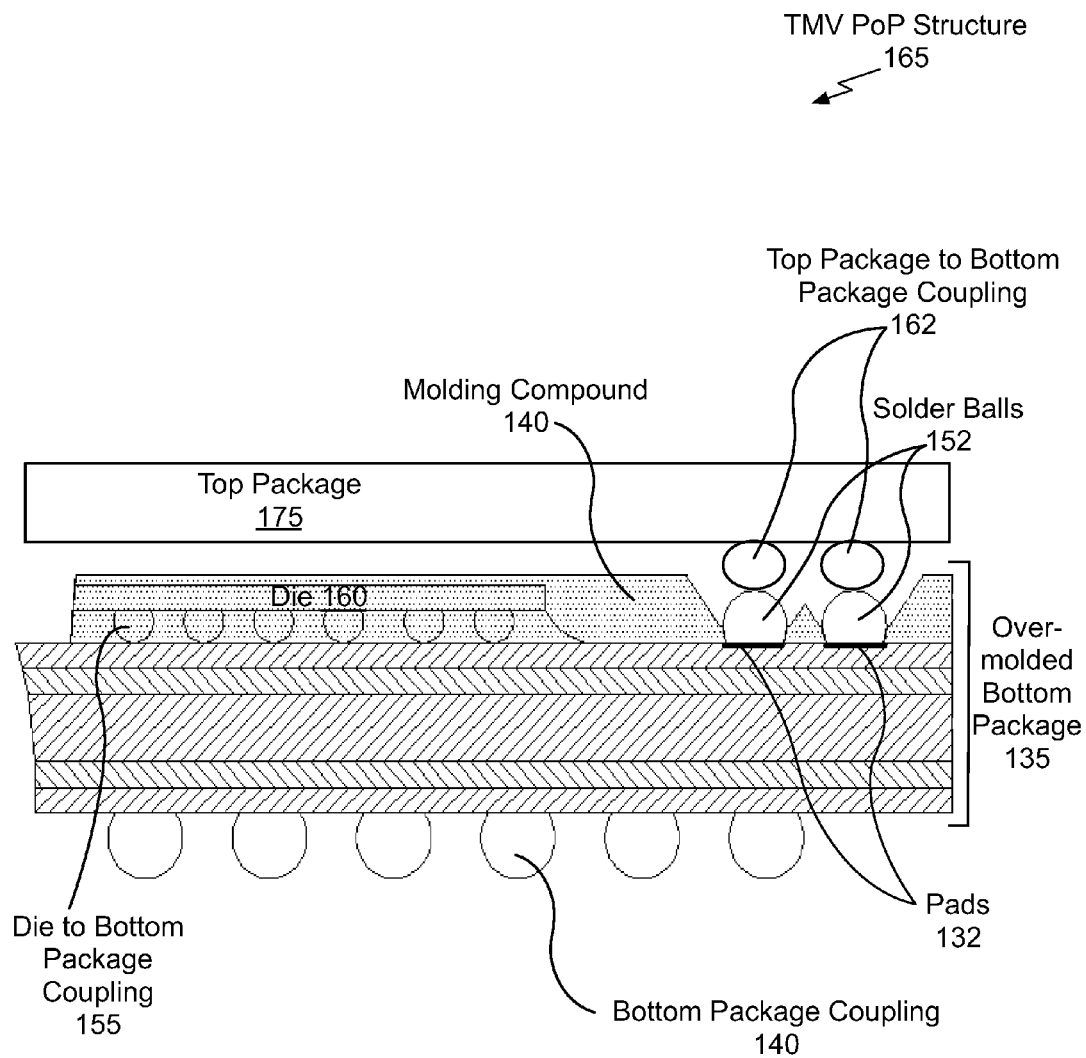
FIG. 1C illustrates the prior art overmolded bottom package of FIG. 1B within a prior art TMV PoP structure.

The overmold process that is performed to produce the overmolded bottom package 135 shown in FIG. 1C is not needed to prepare a cavity bottom package. In contrast with conventional techniques, a non-conductive material is laminated to the top surface layer of the substrate material of a bottom package. In one embodiment, the non-conductive material is laminated to entire top surface layer of the substrate material before an integrated circuit die is mounted onto the bottom package.

Figure 3A:
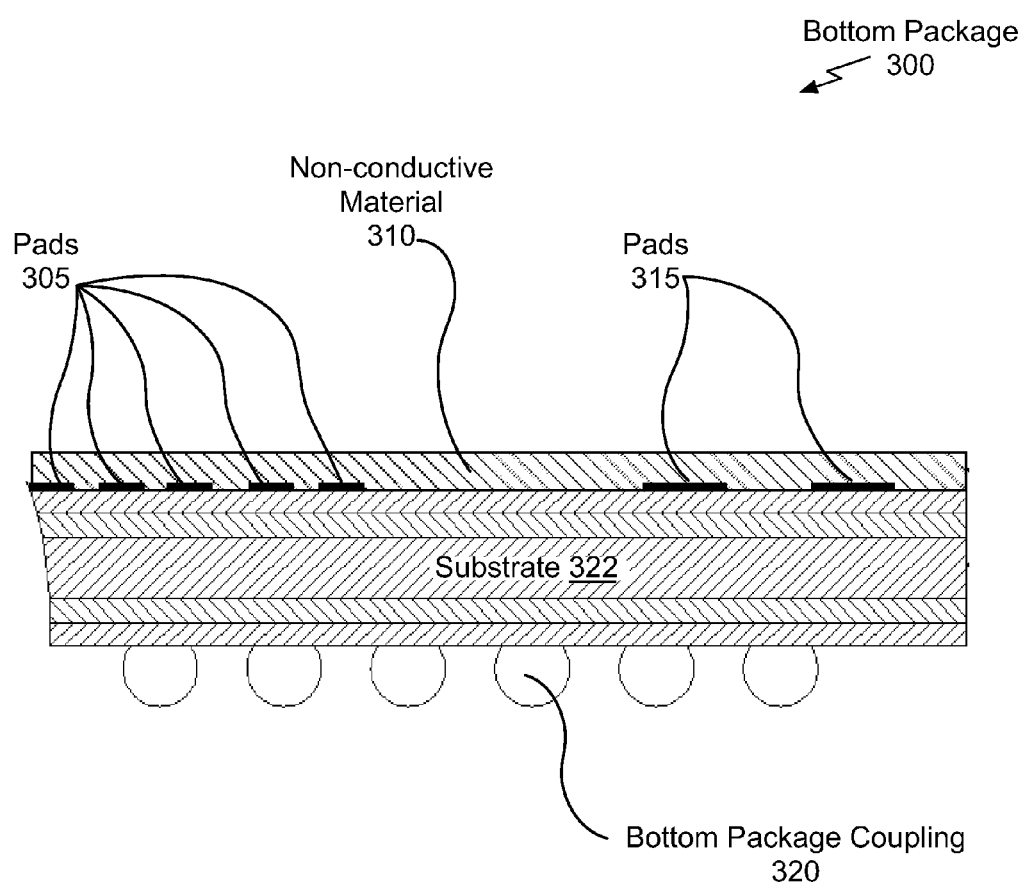
FIG. 3A illustrates a bottom package covered will non-conductive material, in accordance with one embodiment.

FIG. 3A illustrates a bottom package 300 that is covered with the non-conductive material 310, in accordance with one embodiment. The bottom package 300 comprises a substrate material 322, non-conductive material 310, pads 305, and pads 315. The bottom package 300 may also comprise a bottom package coupling 320 (e.g., solder balls, bumps, dots, etc.) that is configured to couple the bottom package 300 to a printed circuit board or other system substrate. A layer of the non-conductive material 310 is applied to the top layer of the substrate material 322 to cover the top surface of the substrate material 322, covering the pads 305 and the pads 315. In one embodiment, the layer of the non-conductive material 310 is laminated to the top surface of the substrate material 322.

In one embodiment, the non-conductive material 310 is a core material, such as prepreg. In one embodiment, the non-conductive material 310 is the same material as the substrate material 322 or is otherwise compatible with the substrate material 322. Using the same material may reduce warpage of the bottom package with cavity 301. In another embodiment, the non-conductive material 310 has a coefficient of thermal expansion that substantially matches (i.e., is within 5% compared with) a coefficient of thermal expansion of the substrate material 322. Using materials having substantially equal coefficients of thermal expansion may reduce warpage of the bottom package 300. In one embodiment, the non-conductive material 310 is a high modular material that is substantially rigid to reduce warpage of the bottom package 300.

Figure 3B:
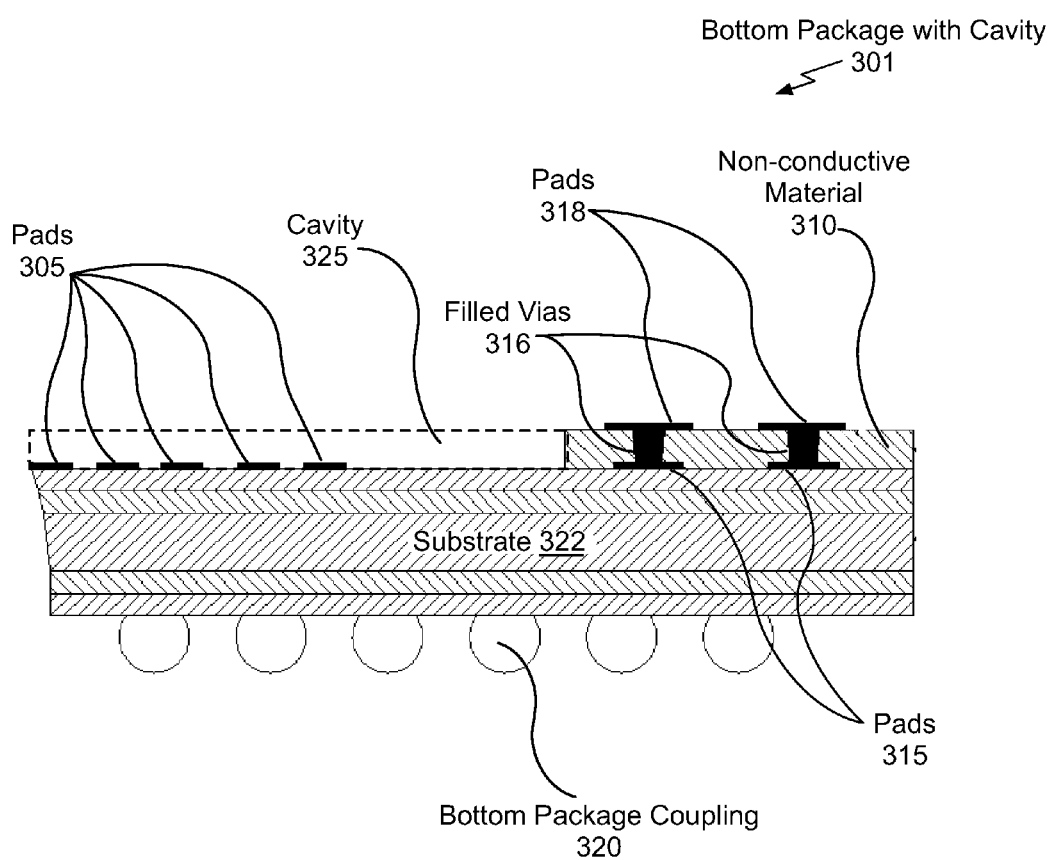
FIG. 3B illustrates the bottom package of FIG. 3A covered with non-conductive material to form a bottom package with cavity, in accordance with one embodiment.

FIG. 3B illustrates the bottom package 300 of FIG. 3A covered with non-conductive material to form a bottom package with cavity 301, in accordance with one embodiment. A region of the layer of the non-conductive material 310 is removed to form the cavity 325 and expose the pads 305. In one embodiment, the region of the layer of the non-conductive material 310 is removed by laser cutting or mechanical drilling. An integrated circuit die may be mounted on top of the bottom package with cavity 301 using a flip-chip (i.e., controlled collapse chip connection) process coupling pads of the integrated circuit die to the exposed pads 305. In one embodiment, a height of the non-conductive material 310 may be determined to be greater than the thickness of the integrated circuit die. In another embodiment a combined height of the non-conductive material 310 and a coupling between a top package and the pads 318 of the bottom package with cavity 301 may be determined to be greater than the combined height of the integrated circuit die and a coupling between the integrated circuit die and the bottom package with cavity 301 when the integrated circuit die is coupled to the pads 305.

A via may be formed at each of the pads 315 to expose the pads 315. The vias may be formed by laser cutting or mechanical drilling through the layer of the non-conductive material 310. In one embodiment, each via of the vias is 80 to 100 microns in diameter. The vias may be filled with conductive material (e.g., copper) to produce the filled vias 316. The pads 318 are formed on the top surface of the layer of the non-conductive material 310. The filled vias 316 electrically couple the pads 318 to the pads 315.

In contrast, with a conventional bottom package of a TMV PoP structure, as shown in FIGS. 1B and 1C, solder balls are not formed at the pads 315. Instead, the pads 318 are formed on the top surface of the layer of the non-conductive material 310 and the pads 318 are coupled to the pads 315 by the filled vias 316. The diameter of the filled vias 316 may be substantially less compared with a conventional solder ball such as the solder balls 152 or a solder ball comprising the top package to bottom package coupling 162 shown in FIGS. 1B and 1C. Therefore, a spacing or pitch of the pads 315 and pads 318 may be reduced compared with pads of a conventional bottom package, such as the pads 122 of FIG. 1A and the pads 132 of FIGS. 1B and 1C, and a greater number of separate electrical connections may be provided by the bottom package with cavity 301.

Figure 3C:
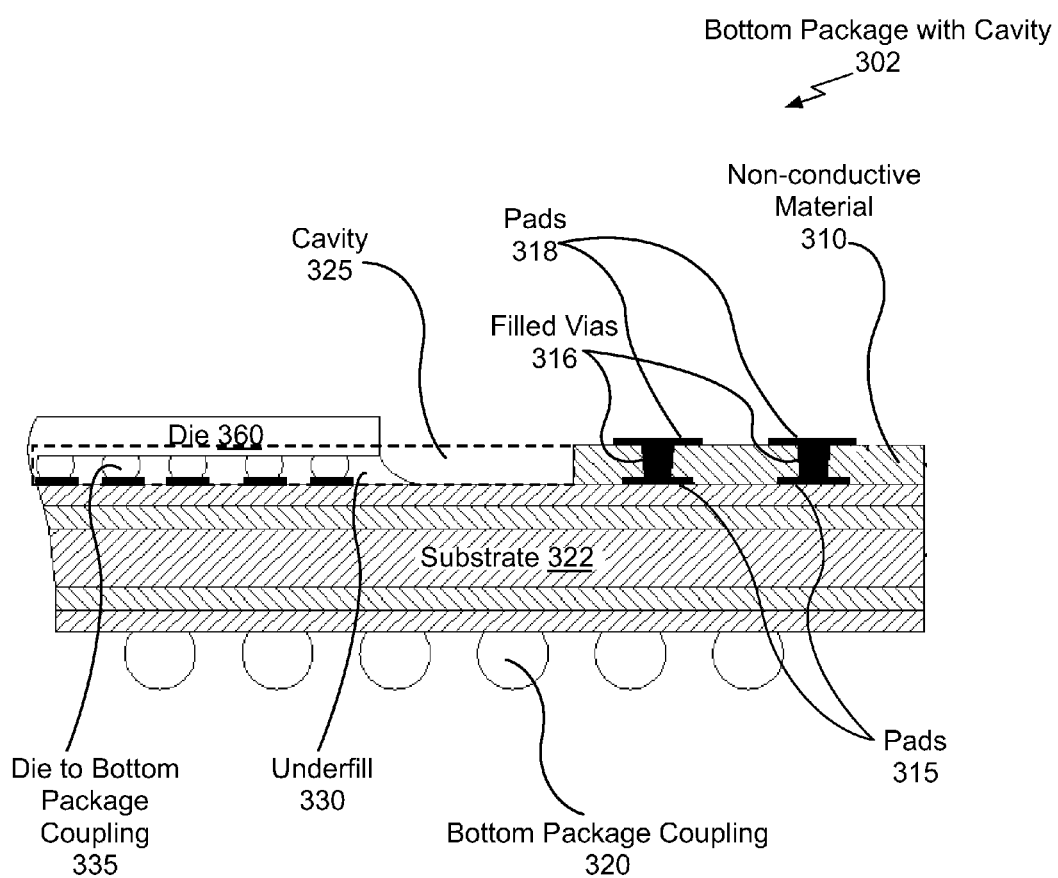
FIG. 3C illustrates the bottom package with cavity of FIG. 3B mounted with an integrated circuit die, in accordance with one embodiment.

FIG. 3C illustrates the bottom package with cavity 301 of FIG. 3B mounted with an integrated circuit die 360 to produce a bottom package with cavity 302, in accordance with one embodiment. The integrated circuit die 360 may be mounted on top of the bottom package with cavity 302 using a flip-chip configuration so that solder balls provide a die to bottom package coupling 335. The bottom package with cavity 302 may be coupled to a top package at the pads 318 to form a PoP structure. For example, each pad of the pads 318 may be configured to receive a solder ball.

As shown in FIG. 3C, underfill 330 is inserted between the integrated circuit die 360 and the top layer of the substrate material 322. An epoxy or similar material may be used as the underfill 330 to reduce electrical shorts between the die to bottom package coupling 335 and improve reliability of the integrated circuit die 360 and the bottom package with cavity 302.

In a conventional manufacturing process for a bottom package, an underflow dam may be used to prevent contamination of the pads 318 when the underfill 330 is inserted. In a conventional bottom package, such as the bottom package 125 shown in FIG. 1A, the spacing between the die to bottom package coupling 115 and the pads 122 should be large enough to construct an underflow dam configured to prevent any underfill from flowing onto and contaminating the pads 122. Similarly, for the overmolded bottom package 135 shown in FIGS. 1B and 1C, the spacing between the die to bottom package coupling 155 and the pads 132 should be large enough to construct an underflow dam configured to prevent any underfill from contaminating the pads 132.

Referring back to FIG. 3C, the underfill 330 is contained within the cavity 325 so no underflow dam is needed. Specifically, because the underfill material does not flow upward, the cavity 325 blocks the flow of the underfill material and functions as an underflow dam. Therefore, the spacing between the die to bottom package coupling 335 and the pads 318 and/or pads 315 may be reduced compared with conventional bottom packages such as the bottom package 125 and the overmolded bottom package 135 that rely on an underflow dam or separation to prevent contamination of pads by underfill.

Figure 3D:
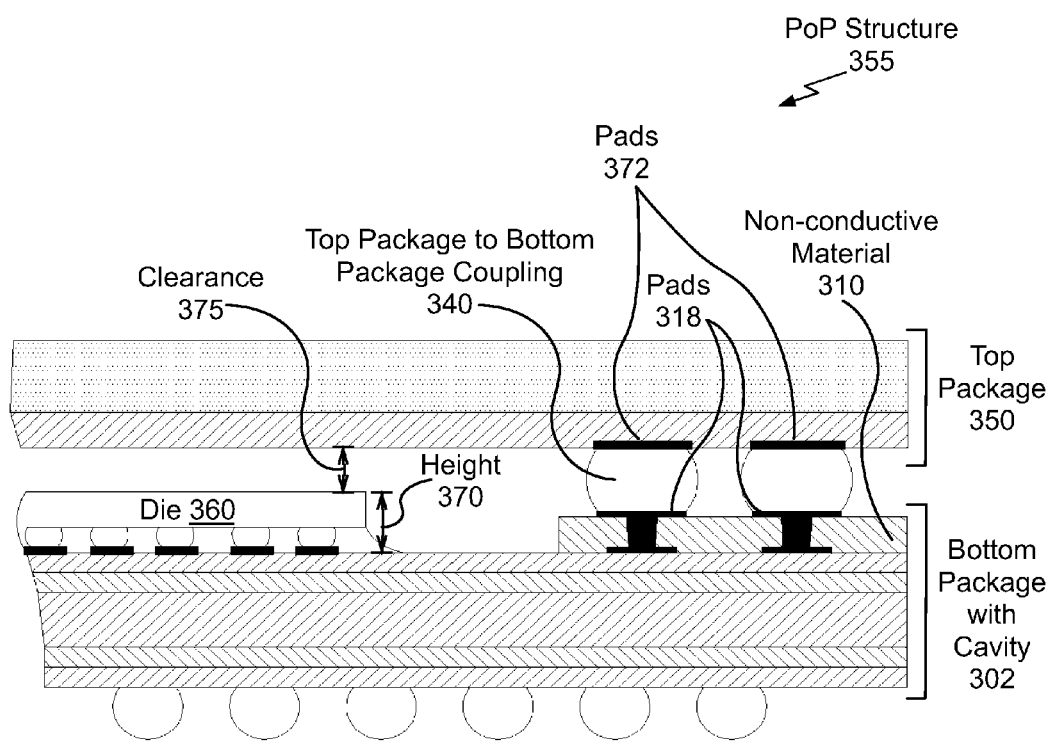
FIG. 3D illustrates the bottom package with cavity of FIG. 3C coupled to a top package, in accordance with one embodiment.

FIG. 3D illustrates the bottom package with cavity 302 of FIG. 3C coupled to a top package 350 to form a PoP structure 355, in accordance with one embodiment. As shown, the top package 350 includes a top package to bottom package coupling 340 (e.g., solder balls) that is electrically coupled to pads 372. The top package 350 is placed on top of the bottom package with cavity 302 and mounted to pads 318 to form the PoP structure 355. In one embodiment, the bottom package with cavity 302 includes an integrated circuit die 360 and the top package 350 includes one or more stacked integrated circuit die (typically memory devices). In one embodiment, the non-conductive material 310 of the bottom package with cavity 302 prevents the top package to bottom package coupling 340 from coming into contact with pads 315 of the bottom package with cavity 302 located beneath the pads 318. Similarly, in one embodiment, the non-conductive material 310 of the bottom package with cavity 302 prevents the top package 350 from coming into contact with the integrated circuit die 360.

Therefore, a size (e.g., diameter, thickness, etc.) of the top package to bottom package coupling 340 may be reduced compared with the size of top package to bottom package coupling 120 and/or 162 and, a pitch of the solder balls in the top package to bottom package coupling 340 may be reduced. For example, a typical size for one of the solder balls 152 and a solder ball in the top package to bottom package coupling 162 shown in FIG. 1C is 200 microns in diameter. In contrast, a size of the solder balls in the top package to bottom package coupling 340 may be 50-100 microns in diameter. In one embodiment, a height of the top package to bottom package electrical coupling 340 between the pads 372 and the pads 318 is less than or equal to 100 microns.

The non-conductive material 310 increases the height of the pads 318 that are coupled to the top package 350. The height of the non-conductive material 310 (or the depth of the cavity 325) can be determined based on a thickness 370 of the integrated circuit die mounted on the top layer of the substrate material 322 and a desired clearance 375 between the top of the integrated circuit die 360 and the top package 350. The non-conductive material 310 also acts as stiffener to help reduce the warpage of the PoP structure 355 and, in particular, of the bottom package with cavity 302. The material used for the non-conductive material 310 may be a high modulus material to act as a stiffener.

Figure 4:
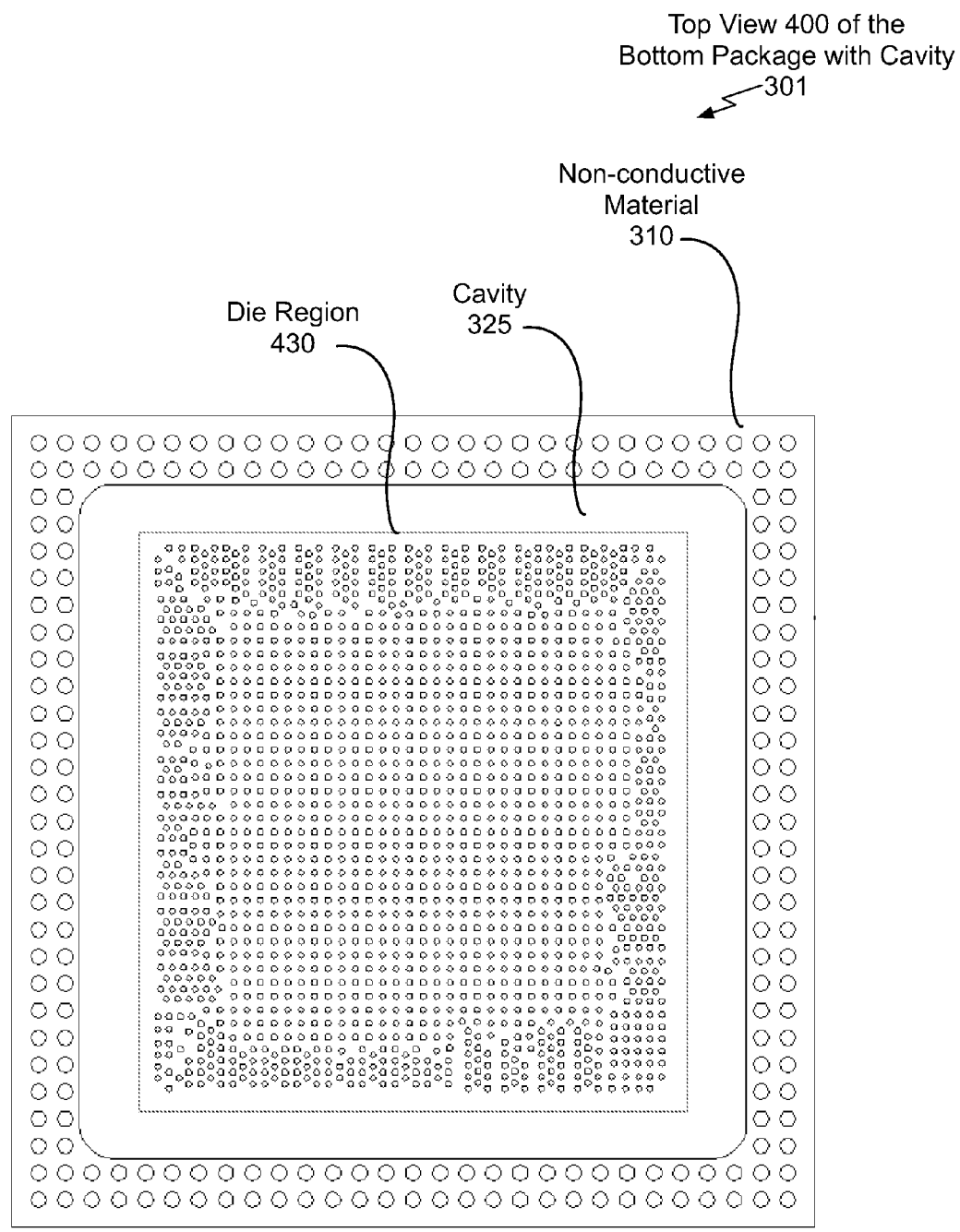
FIG. 4 illustrates a top view of the bottom package with cavity of FIG. 3B, in accordance with one embodiment.

FIG. 4 illustrates a top view 400 of the bottom package with cavity 301 of FIG. 3B, in accordance with one embodiment. A die region 430 comprises the pads 305 shown in FIGS. 3A and 3B. The integrated circuit die 360 may be mounted within the cavity 325 such that pads on the integrated circuit die 360 face and align with pads in the die region 430. The die region 430 is within the cavity 325 and the cavity 325 is formed by removal of the non-conductive material 310. The pads 318 are outside of the cavity 325 and within the region of the non-conductive material 310.

The bottom package with cavity 301 or 302 has several advantages over the conventional bottom package 125 and the conventional overmolded bottom package 135. Specifically, compared with the conventional bottom package 125 and/or the conventional overmolded bottom package 135, the bottom package with cavity 302 is less likely to warp when the non-conductive material 310 is a high modulus material that is stiff. Reducing warpage may result in higher assembly yields for the bottom package with cavity 302 and a PoP structure that uses the bottom package with cavity 302. The overall height of the bottom package with cavity 302 may be reduced compared with the conventional bottom package 125 and/or the conventional overmolded bottom package 135 because a thinner substrate material 322 may be used as a result of the improved stiffness when the non-conductive material 310 is a high modulus material. Finally, because the cavity 335 functions as an underflow dam, the body size of the bottom package with cavity 302 may be reduced compared with the body size of the conventional bottom package 125 and/or the conventional overmolded bottom package 135 (due to the reduced spacing needed between the integrated circuit die 360 and the pads 315 and/or pads 318.

Compared with the conventional overmolded bottom package 135, the bottom package with cavity 302 may be simpler to construct because the molding compound 140, the solder balls 152, and the mold removal process to form the laser-cut vias 142 are not needed. A processing step of depositing the non-conductive material 310 on the substrate 322 is typically easier compared with depositing the molding compound 140. Similarly, forming the filled vias 316 and the cavity 325 is easier compared with forming the laser-cut vias 142. Compared with the conventional overmolded bottom package 135, the bottom package with cavity 302 may have better thermal dissipation because the molding compound 140 is not used. Improved thermal dissipation may result in improved electrical performance for the bottom package with cavity 302. Additionally, the bottom package with cavity 302 may have better electrical performance compared with the conventional overmolded bottom package 135 because the pitch of the pads 372, pads 318, and the pads 315 may be reduced compared with the pitch of the pads 132 of the overmolded bottom package 135.

Figure 5:
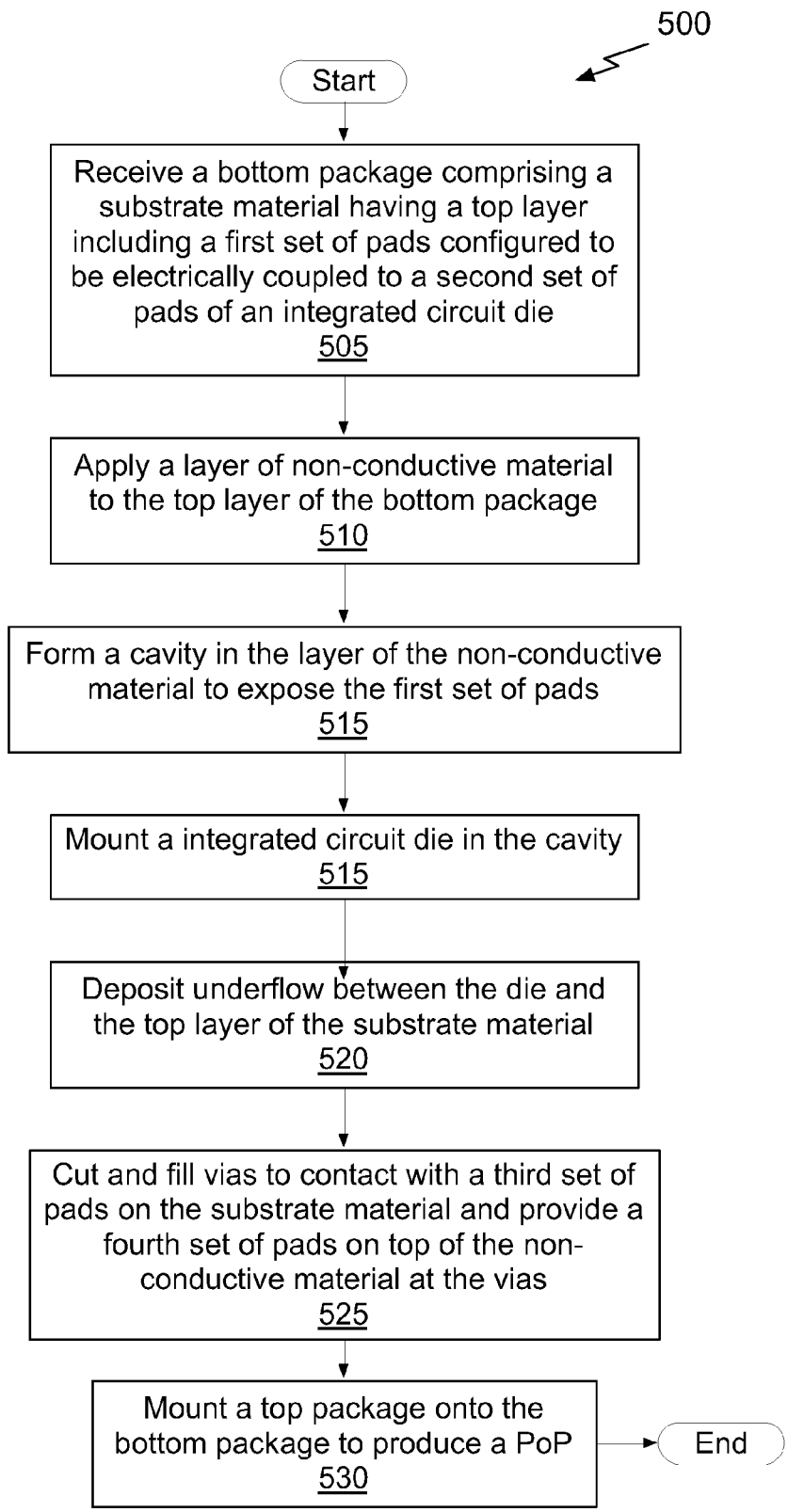
FIG. 5 illustrates a flowchart of another method for preparing a PoP structure using a bottom package with cavity, in accordance with one embodiment.

FIG. 5 illustrates a flowchart of a method 500 for preparing a PoP structure using a bottom package with cavity, in accordance with one embodiment. Although method 500 is described in the context of certain circuit and system implementations described in FIGS. 3A, 3B, 3C, 3D, 4, and 6, the method 500 may also be performed by a software program, other custom circuitry, or by a combination of custom circuitry and a software program. Furthermore, persons of ordinary skill in the art will understand that any system that performs method 500 is within the scope and spirit of embodiments of the present invention.

At step 505, a bottom package comprising the substrate material 322 is received. The substrate material 322 comprises a top layer including a first set of pads 305 that are configured to be electrically coupled to a second set of pads of an integrated circuit die 360. At step 510, the layer of the non-conductive material 310 is applied to the top layer of the bottom package.

At step 515, the cavity 325 is formed to expose the first set of pads 305, where the cavity 325 is configured to contain the integrated circuit die 360 oriented such that the second set of pads face the first set of pads 305. At the step 515, the integrated circuit die 360 is mounted in the cavity 325, so that the first set of pads 305 are electrically coupled to the second set of pads by the die to bottom package coupling 335.

At step 520, the underflow 330 is deposited between the integrated circuit die 360 and the bottom package with cavity 301 to form the bottom package with cavity 302. At step 525, vias are formed to provide channels through the non-conductive material 310 and filled to contact with a third set of pads 315 on the top layer of the substrate material 322. A fourth set of pads 318 are provided on top of the layer of the non-conductive material 310 at the filled vias 316. At step 530, a top package is mounted onto the bottom package with cavity 302 to form the PoP structure 355.

Figure 6:
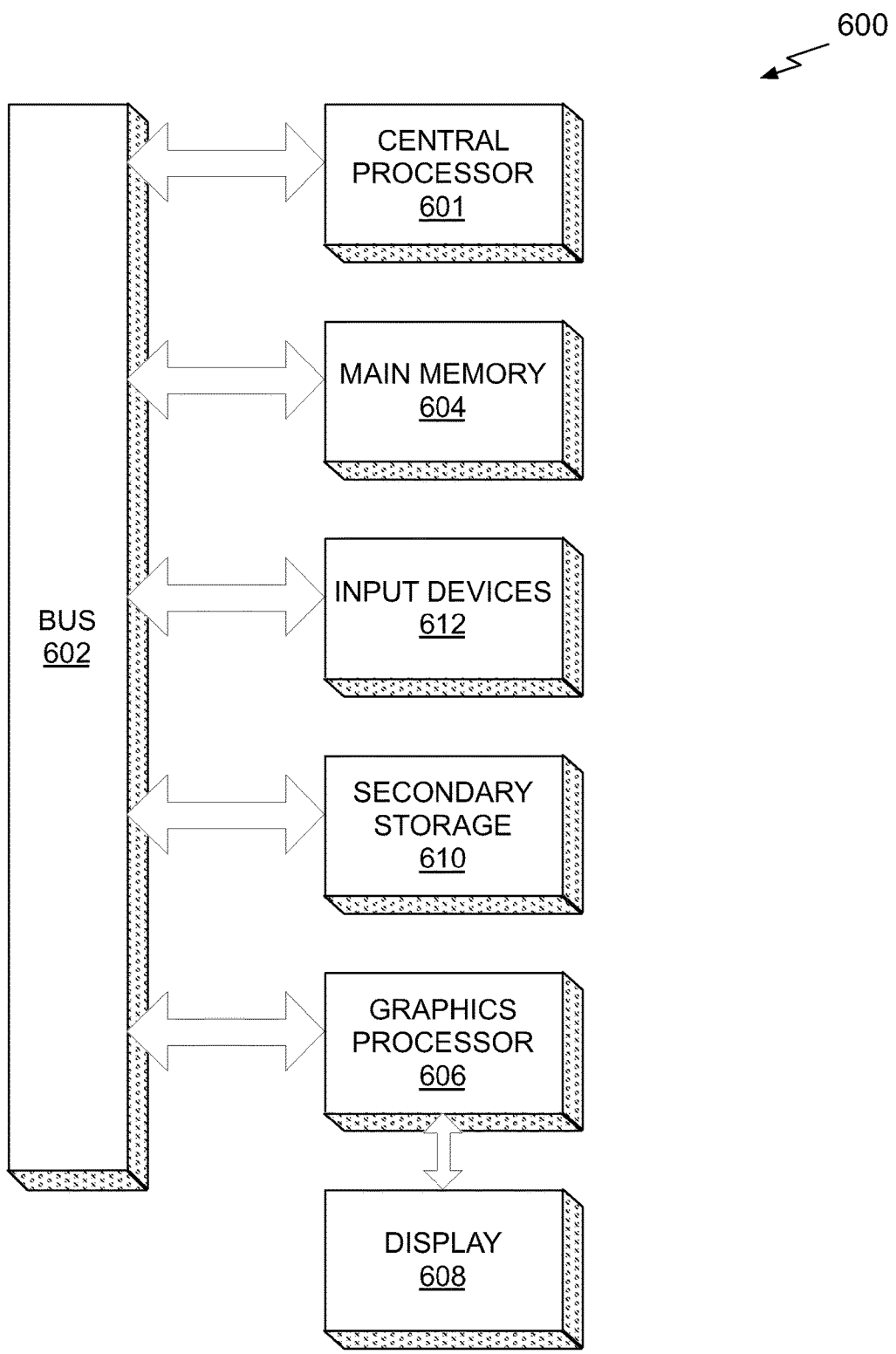
FIG. 6 illustrates an exemplary system in which the various architecture and/or functionality of the various previous embodiments may be implemented.

FIG. 6 illustrates an exemplary system 600 in which the various architecture and/or functionality of the various previous embodiments may be implemented. As shown, a system 600 is provided including at least one central processor 601 that is connected to a communication bus 602. The communication bus 602 may be implemented using any suitable protocol, such as PCI (Peripheral Component Interconnect), PCI-Express, AGP (Accelerated Graphics Port), HyperTransport, or any other bus or point-to-point communication protocol(s). The system 600 also includes a main memory 604. Control logic (software) and data are stored in the main memory 604 which may take the form of random access memory (RAM).

The system 600 also includes input devices 612, a graphics processor 606, and a display 606, i.e. a conventional CRT (cathode ray tube), LCD (liquid crystal display), LED (light emitting diode), plasma display or the like. User input may be received from the input devices 612, e.g., keyboard, mouse, touchpad, microphone, and the like. In one embodiment, the graphics processor 606 may include a plurality of shader modules, a rasterization module, etc. Each of the foregoing modules may even be situated on a single semiconductor platform to form a graphics processing unit (GPU).

In the present description, a single semiconductor platform may refer to a sole unitary semiconductor-based integrated circuit or chip. It should be noted that the term single semiconductor platform may also refer to multi-chip modules with increased connectivity which simulate on-chip operation, and make substantial improvements over utilizing a conventional central processing unit (CPU) and bus implementation. Of course, the various modules may also be situated separately or in various combinations of semiconductor platforms per the desires of the user.

The system 600 may also include a secondary storage 610. The secondary storage 610 includes, for example, a hard disk drive and/or a removable storage drive, representing a floppy disk drive, a magnetic tape drive, a compact disk drive, digital versatile disk (DVD) drive, recording device, universal serial bus (USB) flash memory. The removable storage drive reads from and/or writes to a removable storage unit in a well-known manner.

Computer programs, or computer control logic algorithms, may be stored in the main memory 604 and/or the secondary storage 610. Such computer programs, when executed, enable the system 600 to perform various functions. The memory 604, the storage 610, and/or any other storage are possible examples of computer-readable media.

In one embodiment, the architecture and/or functionality of the various previous figures may be implemented in the context of the central processor 601, the graphics processor 606, an integrated circuit (not shown) that is capable of at least a portion of the capabilities of both the central processor 601 and the graphics processor 606, a chipset (i.e., a group of integrated circuits designed to work and sold as a unit for performing related functions, etc.), and/or any other integrated circuit for that matter.

One or more of the central processor 601, graphics processor 606, and main memory 604 may be implemented as the integrated circuit die 360 that is included in the bottom package with cavity 302.

Still yet, the architecture and/or functionality of the various previous figures may be implemented in the context of a general computer system, a circuit hoard system, a game console system dedicated for entertainment purposes, an application-specific system, and/or any other desired system. For example, the system 600 may take the form of a desktop computer, laptop computer, server, workstation, game consoles, embedded system, and/or any other type of logic. Still yet, the system 600 may take the form of various other devices including, but not limited to a personal digital assistant (PDA) device, a mobile phone device, a television, etc.

Further, while not shown, the system 600 may be coupled to a network (e.g., a telecommunications network, local area network (LAN), wireless network, wide area network (WAN) such as the Internet, peer-to-peer network, cable network, or the like) for communication purposes.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

What is claimed is:

1. A method comprising:
receiving a bottom package comprising a substrate material having a top layer including a first set of pads and a second set of pads, wherein the first set of pads is configured to be electrically coupled to a third set of pads of an integrated circuit die;
applying a layer of non-conductive material to the top layer of the bottom package, wherein the layer of non-conductive material directly covers both the first set of pads and the second set of pads; and
removing a portion of the layer of non-conductive material to form a cavity in the layer of non-conductive material that exposes the first set of pads before forming vias through the layer of non-conductive material outside of the cavity, wherein the cavity is configured to contain the integrated circuit die oriented such that the third set of pads of the integrated circuit die face the first set of pads.

2. The method of claim 1, further comprising depositing underflow material between the integrated circuit die and the top layer of the substrate material.

3. The method of claim 2, wherein the underflow material is contained within the cavity.

4. The method of claim 1, wherein the vias are produced by laser drilling.

5. The method of claim 1, wherein each via of the vias is less than or equal to 100 microns in diameter.

6. The method of claim 1, further comprising:
filling the vias with a conductive material; and
producing a fourth set of pads on a top surface of the layer of the non-conductive material, the fourth set of pads being electrically coupled to the second set of pads by the filled vias.

7. The method of claim 6, further comprising mounting a top package above the bottom package to produce a package-on-package structure, wherein a fifth set of pads included in the top package are electrically coupled to the fourth set of pads.

8. The method of claim 7, wherein a height of an electrical coupling between the fifth set of pads and the fourth set of pads is less than or equal to 100 microns.

9. The method of claim 1, wherein the non-conductive material is the substrate material.

10. The method of claim 1, wherein a first coefficient of thermal expansion of the non-conductive material substantially equals a second coefficient of thermal expansion of the substrate material.

11. The method of claim 1, wherein the non-conductive material is a prepreg material.

12. The method of claim 1, wherein the non-conductive material is a high modulus material.

13. A bottom package, comprising:
a substrate material having a top layer including a first set of pads and a second set of pads, wherein the first set of pads is configured to be electrically coupled to a third set of pads of an integrated circuit die;
a layer of non-conductive material applied to the top layer of the bottom package, wherein the layer of non-conductive material completely and directly covers the second set of pads; and
a cavity in the layer of the non-conductive material that exposes the first set of pads, wherein the layer of non-conductive material directly covers the top layer of the bottom package outside of the cavity.

14. The bottom package of claim 13, wherein the non-conductive material is the substrate material.

15. The bottom package of claim 13, wherein a first coefficient of thermal expansion of the non-conductive material substantially equals a second coefficient of thermal expansion of the substrate material.

16. The bottom package of claim 13, wherein the non-conductive material is a prepreg material.

17. The bottom package of claim 13, wherein the cavity is configured to contain the integrated circuit die oriented such that the third set of pads of the integrated circuit die face the first set of pads.

18. The bottom package of claim 13, further comprising underflow material between the integrated circuit die and the top layer of the substrate material.

19. The bottom package of claim 13, further comprising vias formed through the layer of non-conductive material outside of the cavity.

20. The bottom package of claim 19, wherein the vias are filled with a conductive material and further comprising a fourth set of pads on a top surface of the layer of the non-conductive material.

* * * * *